(12) United States Patent
Tseng et al.

(10) Patent No.: US 6,201,300 B1
(45) Date of Patent: Mar. 13, 2001

(54) PRINTED CIRCUIT BOARD WITH THERMAL CONDUCTIVE STRUCTURE

(75) Inventors: Tzyy-Jang Tseng, Hsinchu; David C. H. Cheng, Taoyuan Hsien; Shaw-Wen Lao, Hsinchu Hsien, all of (TW)

(73) Assignee: World Wiser Electronics Inc., Taoyuan Hsien (TW)

( * ) Notice: Subject to any disclaimer, the term of this patent is extended or adjusted under 35 U.S.C. 154(b) by 0 days.

(21) Appl. No.: 09/138,799

(22) Filed: Aug. 24, 1998

(30) Foreign Application Priority Data

Apr. 22, 1998  (TW) .................................... 87106139

(51) Int. Cl.⁷ ............................... H05K 3/34; H05K 7/20; H01L 23/34; H01L 23/48
(52) U.S. Cl. .......................... 257/706; 257/712; 257/713; 257/700; 257/701; 257/758; 257/704; 257/710; 257/774; 257/737; 257/738; 29/840; 29/846; 174/16.3
(58) Field of Search ................................... 257/702, 707, 257/709, 712, 713, 717, 720, 668, 675, 794, 700–703, 758, 738, 737, 734, 774, 773, 693; 29/840, 846; 174/16, 3

(56) References Cited

U.S. PATENT DOCUMENTS

| | | | |
|---|---|---|---|
| 4,561,006 | * 12/1985 | Currie . | |
| 4,667,220 | * 5/1987 | Lee et al. . | |
| 4,812,949 | * 3/1989 | Fontan et al. | 361/386 |
| 4,888,247 | * 12/1989 | Zweben et al. | 478/105 |
| 4,890,152 | * 12/1989 | Hirata et al. | 174/52.5 |
| 5,027,191 | * 6/1991 | Bourdelaise et al. | 361/386 |
| 5,144,412 | * 9/1992 | Chang et al. . | |
| 5,339,519 | * 8/1994 | Fortune | 29/840 |
| 5,357,672 | * 10/1994 | Newman | 29/830 |
| 5,424,573 | * 6/1995 | Kato et al. | 257/431 |
| 5,834,840 | * 11/1998 | Robbins et al. | 257/706 |

* cited by examiner

Primary Examiner—Alexander O. Williams
(74) Attorney, Agent, or Firm—Thomas, Kayden, Horstemeyer & Risley

(57) ABSTRACT

A printed circuit board thermal conductive structure comprises a thermal spreader layer having an embossed pattern formed on its surface, an adhesive glue layer formed over the thermal spreader, and a surface metallic layer attached to the thermal spreader and the glue layer. A portion of the surface metallic layer is in direct contact or almost direct contact with the thermal spreader. Furthermore, an additional external heat sink can be attached to thermal conductive structure to increase the efficiency of heat dissipation.

31 Claims, 4 Drawing Sheets

PRINTED CIRCUIT BOARD WITH THERMAL CONDUCTIVE STRUCTURE

CROSS-REFERENCE TO RELATED APPLICATION

This application claims the priority benefit of Taiwan application serial no. 87106139, filed Apr. 22, 1998, the full disclosure of which is incorporated herein by reference.

BACKGROUND OF THE INVENTION

1. Field of Invention

The present invention relates to an ultra-high efficiency printed circuit board (PCB) thermal conductive structure. More particularly, the present invention relates to a packaging method that utilizes an ultra-high efficiency thermal conductive structure.

2. Description of Related Art

In a module that contains an integrated circuit (IC), a large number of conductive wires normally emanate from the IC chip. Hundreds of connections have to be made externally to complete the circuit. In the past, there have been a variety of different circuit connections and packaging methods. The most commonly used packaging methods include planar packaging, hermetic and plastic chip carrier packaging, and grid array packaging.

Among the conventionally used packaging methods for IC chips, packages that includes a lead frame and a number of connective wires to connect between a semiconductor chip and external terminals are quite common. However, as the integrated circuit becomes more precise and interconnection becomes more complicated, the number of wires necessary for connecting the chip to the outside world soars. Therefore, conventional techniques that rely on wiring connection to a lead frame gradually become highly deficient. Consequently, new packaging method that can accommodate more wiring connections and more complicated circuits are being developed.

Currently, one type of packaging that can accommodate more wiring connections and more complicated circuits is a ball grid array (BGA). The BGA is a square array type of packaging where the wiring terminals are solder balls. These wiring terminals are fabricated into solder balls so they can be easily attached to the bonding pads of a printed wire board (or printed circuit board) or the surface of an appropriate device.

In reality, a conventional BGA type of connection can be regarded as a miniaturized multi-layered printed circuit board that connects an IC chip with external terminals through a series of internal conductors. These internal conductors are in turn connected by through holes in a metallic layer or metallic plugs.

In a conventional cavity-down type of BGA package, two or more metallic layers are compressed together and attached to a peripheral region of the substrate. These metallic layers are labeled as 108 and 112 in FIG. 1, which is a cross-sectional view showing a conventional ball grid array package. FIG. 1a is a magnified view showing the conductive layer of the first conventional package structure as shown in FIG. 1. The overall thickness of these metallic layers limits the maximum height of the solder balls. Since most IC chips have a thickness comparable or slightly thicker than the solder balls, the BGA package may act as a barrier to contacts between the solder balls and the printed circuit board. Hence, with the limitation on maximum height, it becomes preferable to mount the IC chip on one side of the substrate and then mount the solder balls on the opposite side of the substrate. However, with this arrangement, electrical connection between the chip and the solder balls must be achieved through metallic layers on both sides of the substrate and additional holes and plugs that penetrate through the substrate. Although this method can accommodate a large number of wiring connections, the manufacturing process is complicated and its production cost is high. For example, the substrate has to be specially made, holes and plugs have to be specially formed in the substrate, and the substrate and the metallic layers have to be specially joined together. At present, methods of cooling a package include the installation of a heat sink on the top of the chip, or drilling a hole underneath the chip that penetrates the substrate and the metallic layer. However, these methods not only increase the number of manufacturing steps, but also increase the cost of production as well.

To resolve the aforementioned problems, a package structure that involves multi-layered printed wire board and the use of adhesive glue (Prepreg) has been proposed by LSI Logic Corporation in U.S. Pat. No. 5,357,672. FIG. 1 is a cross-sectional view showing the proposed package structure. As shown in FIG. 1, silicon chip 101 is installed inside the central cavity. The central cavity is surrounded by printed circuit boards cut out and stacked on top of each other to form a tier structure. Near the edges of the tiers are bonding pads 105. Bonding wires are used to connect the bonding pad of the IC chip to the bonding pads 105 on the edge of the printed circuit board tier. Then, from the bonding pads 105, connections are made to respective bumps 109 through the printed circuit board and through holes 107. Finally, any signals coming from the IC chip can be sent to a main board. In the patent, the structure formed by gluing the printed circuit boards together is used as a substrate, and the silicon chip is mounted in the cavity enclosed by the substrate. Hence, the silicon chip and the bumps are on the same side of the substrate. Consequently, it is not necessary to employ two conductive layers on each side of the substrate to make connection.

FIG. 2 is a perspective view showing a second package structure by Washington Electric Corporation in U.S. Pat. No. 5,027,191. The IC chip 201 is installed inside the chip carrier. The IC chip 201 is connected to the bonding pads on the bonding ledge 205 through a series of bonding wires 203. Electrical connections are also made between the bonding pads on the bonding ledge 205 to the regularly spaced contact pads 207 on the surface of the chip carrier. Hence, electrical signals coming from the IC chip can be transmitted to the main board outside. The IC chip is facedown in this type of package design. Therefore, a heat sink can be installed on the bottom surface of the printed circuit board or on the top surface of the chip carrier in order to dissipate heat.

FIG. 3 is a cross-sectional view showing a type of IC package proposed by Motorola in one of its U.S. Patent applications. As shown in FIG. 3, the package has a plastic BGA (PBGA) structure having a silicon chip 301 directly attached to a central location of the printed circuit board substrate 300. A number of bonding wires 303 are used for connecting the bonding pads on the silicon chip 301 to the bonding pads 305 on the printed circuit board. The bonding pads 305 are in turn connected to the external solder balls 307 through printed circuits and via connections. The chip and the internal wires are enclosed within a protective plastic mold. In addition, a vent hole is formed underneath the silicon chip to increase heat dissipation.

Common features of the packages described above includes their capacity for accommodating vast quantities of conductive wires inside the package, or having their silicon chip and solder balls assembled on the same side of a substrate. However, all of them require the attachment of an external heat sink. Therefore, the package becomes bulkier and mass production of the package is more difficult. Moreover, to achieve full wiring connections, the printed circuit boards has to be shaped into a multi-tier structure. Hence, cost and difficulties of production are increased.

In light of the foregoing, there is a need to provide a method of improving the thermal conductive structure inside a printed circuit board.

SUMMARY OF THE INVENTION

Accordingly, the present invention provides a thermal conductive structure on a printed circuit board, wherein the chip mount pad is in direct contact or almost direct contact with a piece of metal, a piece of thermally conductive ceramic, or a polymer heat spreader, thereby forming the most direct heat conductive path away from a silicon chip carrier. An external heat sink can also be added so that some other portion of the heat generated by the silicon chip can be channeled away. Moreover, these thermal conductive structures are easy to manufacture and can be mass produced at a moderate cost. Besides PCBs, the above thermal conductive structure can be applied to BGA packages, chip scale packages (CSPs) and multi-chip modules (MCM).

In another aspect, this invention provides a silicon chip packaging structure, wherein a silicon chip is placed on a chip mount pad that is in direct contact with a piece of metal, a piece of thermally conductive ceramic, or a polymer heat spreader so that the silicon chip is connected to the most direct and most efficient thermal conductive path for heat dissipation. With the addition of an external heat sink, an additional portion of the heat generated by the silicon chip, other than the heat channeled away through some internal thermal vias can be dissipated away.

To achieve these and other advantages and in accordance with the purpose of the invention, as embodied and broadly described herein, the invention provides a printed circuit board thermal conductive structure. The structure comprises a thermal spreader layer having an embossed pattern formed on its surface, an adhesive glue layer formed over the thermal spreader, and a surface metallic layer attached to the thermal spreader and the glue layer. A portion of the surface metallic layer is in direct contact or almost direct contact with the thermal spreader. Furthermore, an additional external heat sink can be attached to thermal conductive structure to the efficiency of heat dissipation.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
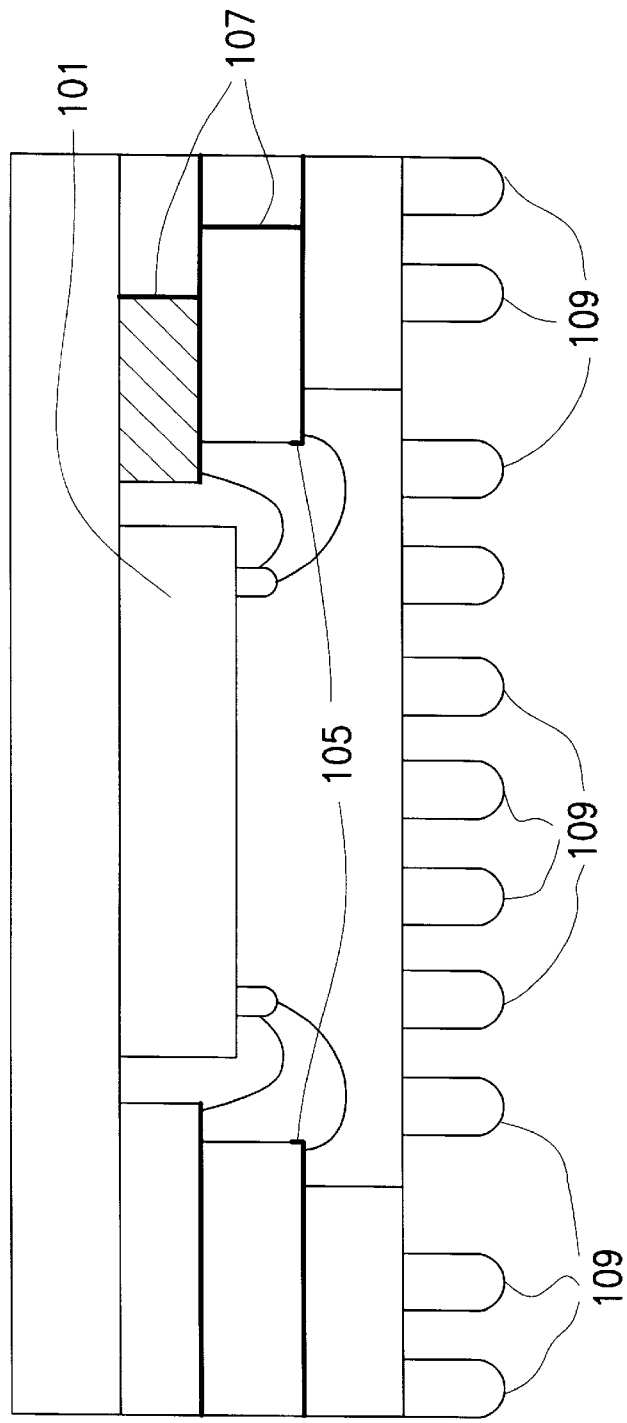
FIG. 1 is a cross-section showing a first conventional package structure.
Figure 1A:
FIG. 1a is a magnified view showing the conductive layer of the first conventional package structure as shown in FIG. 1.
Figure 2:
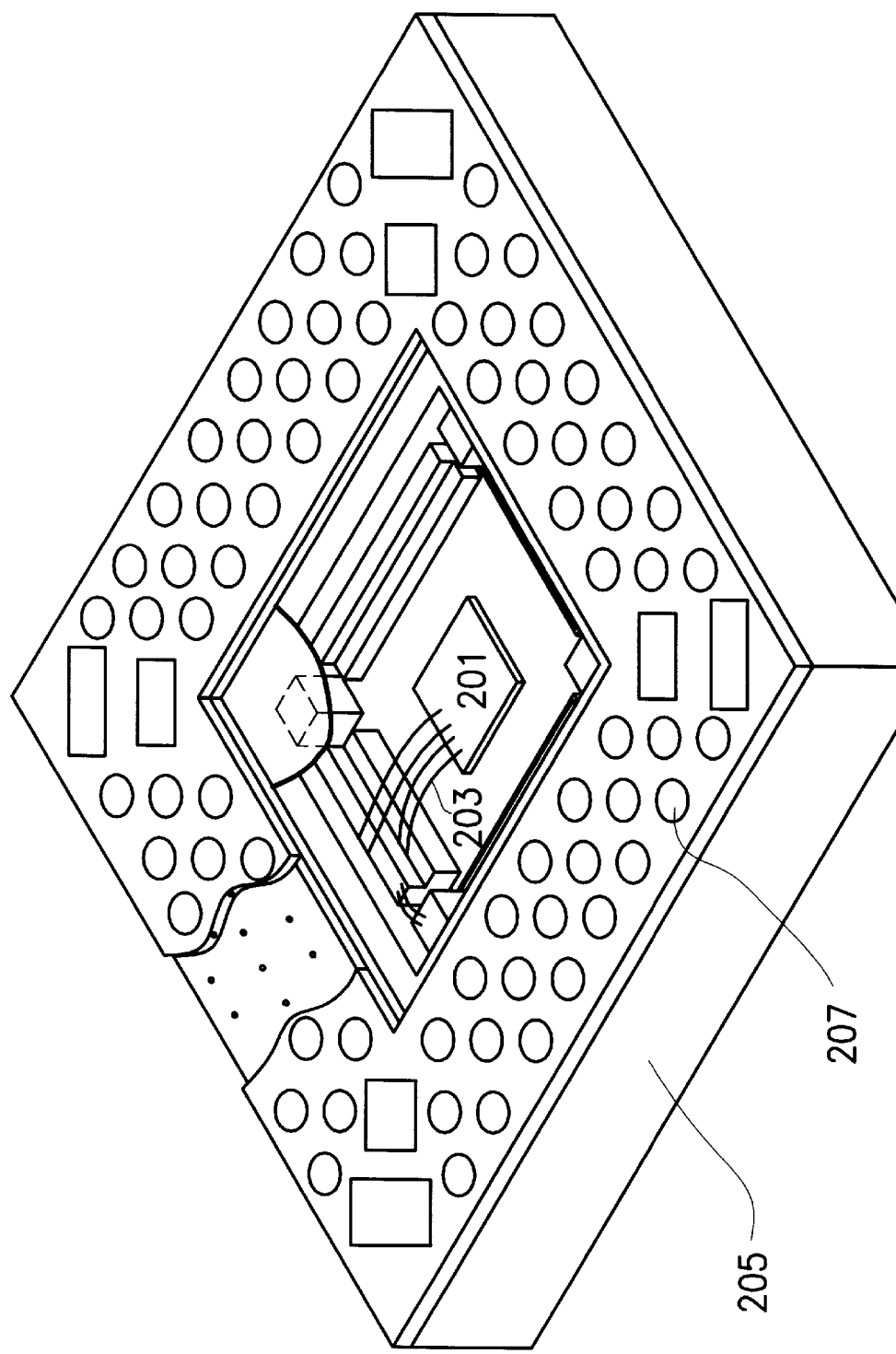
FIG. 2 is a perspective view showing a second conventional package structure.
Figure 3:
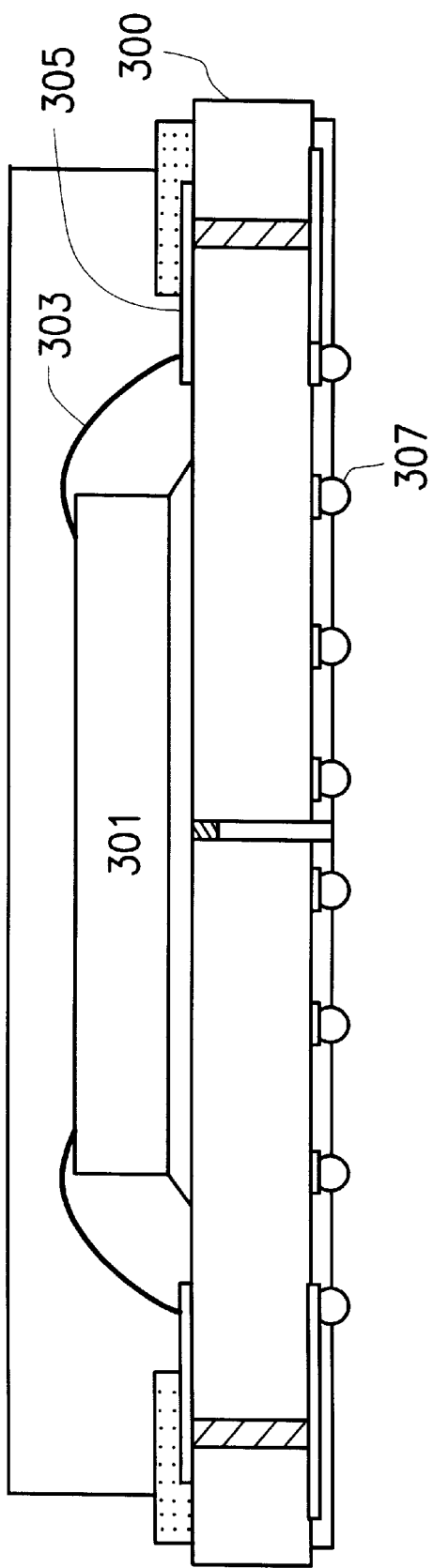
FIG. 3 is a cross-sectional view showing a third conventional package structure.

Reference will now be made in detail to the present preferred embodiments of the invention, examples of which are illustrated in the accompanying drawings. Wherever possible, the same reference numbers are used in the drawings and the description to refer to the same or like parts.

This invention provides a method of forming a thermal conductive structure on a printed circuit board so that a heat source has direct or almost direct contact with an efficient thermal conductive path. Nowadays, in an era where the electronic products must be highly precise, slim, light and have good heat dissipation, the printed circuit board structure formed by the method of this invention is capable of meeting some of these demands. The techniques used in this invention are different from the conventional method. This invention utilizes the formation of a highly irregular surface on a heat spreader, that is, a heat spreader having an embossed surface. Furthermore, a chip mount pad for carrying a silicon chip is in direct contact or almost direct contact with the heat spreader. Hence, the thermal conductive path dissipating heat is reduced considerably and the resulting heat dissipation is very much faster. Since no extra material is required for forming these structures and the method of fabrication quite simple, the structure can be mass-produced at a very low cost.

Figure 4:
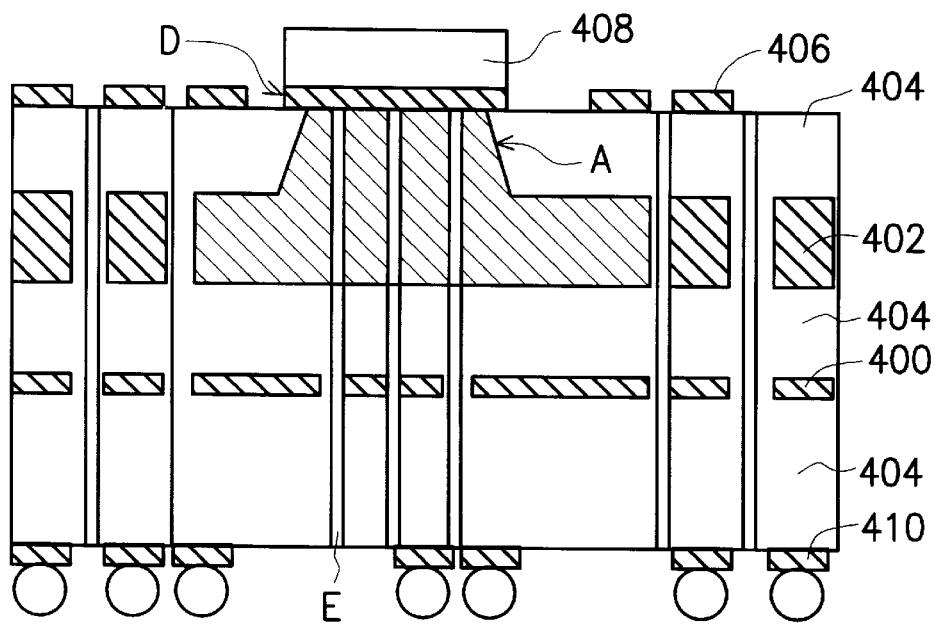
FIG. 4 is a cross-sectional view showing, a package structure according to one preferred embodiment of this invention.
Figure 5:
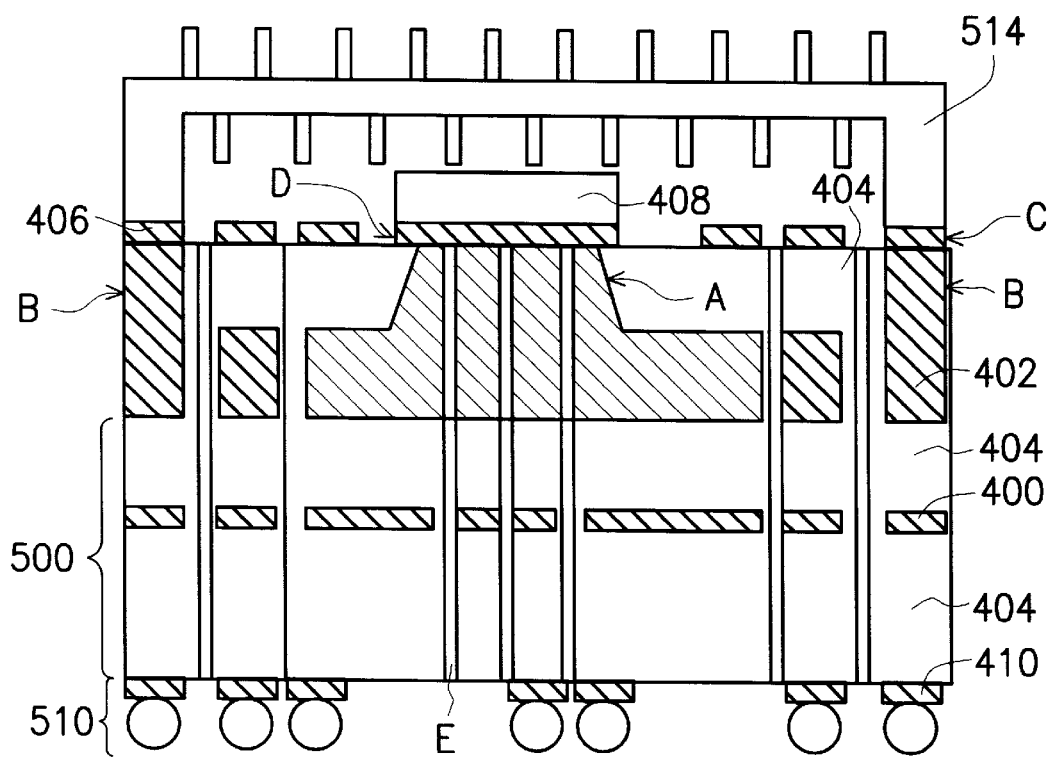
FIG. 5 is a cross-sectional view showing a package structure having an additional external heat sink according to one preferred embodiment of this invention.

FIG. 4 is a cross-sectional view showing a package structure according to one preferred embodiment of this invention. The thermal conductive path in a printed circuit board is shown in FIG. 4. First, as shown in FIG. 4, a pattern is formed on the surface of a heat spreader. Next, using a vacuum compression method, various metallic layers (400, 406, 410) with a plastic sheet (Prepreg) and epoxy in between are pressed together in separate operations. Thereafter, using photolithographic and etching methods, the structures as shown in FIGS. 4 and 5 are formed. The heat spreader 402 can be made from material such as metal, ceramics, or polymer. If the heat spreader 402 is made of metal, the pattern embossed surface on the heat spreader 402 can be fabricated according to the actual conditions using one of the following methods:

1. A mechanical drill is used to bore through-holes, and then a punch press is used to form a rough, embossed surface.

2. The metallic layer is drilled to form through-holes, and then the surface of the metallic layer is etched to form a pattern using photolithographic and chemical etching methods.

3. Photolithographic and etching methods are used to form through-holes in the metallic layer, and then a punch press is used to form an embossed surface, similar to that described in method 1, above.

4. Photolithographic and etching methods are employed twice to form the respective through-holes and pattern the surface of a metallic layer.

On the other hand, if the material for forming the heat spreader 402 is ceramic or polymer, a molding method can be used to form the irregular embossed pattern on its surface.

In the structure, the metallic layer 402 has a thickness of about 5–12 mil, and the depth of the recessed cavities is kept between 0.5–2.5 mil. The metallic layers are assembled together using adhesive glue sheets with a thickness of 2–4.5 mil or resin-coated copper plates. The adhesive glue layer can be one of the materials that include, for example, Fr-4, Fr-5, Bismalemide Triazine (BT-Prepreg) or polyphenylene ether (PPE), for example. By compressing a glue layer 404 with a metallic layer in a vacuum, one after another, a complete stack having an adhesive glue layer 404 between the surface metallic layer 406, the heat spreader 402, the metallic layer 400 and the metallic layer 410 is formed. Alternatively, a resin-coated copper plate can be used as a substitute for the metallic layer 406 and the adhesive glue layer 404. In real applications, a portion of the metallic layer 406 (such as region A in FIGS. 4 and 5) is in direct contact or almost direct contact with the heat spreader 402 below. The surface above the contacting region of the metallic layer 406 forms a chip mount pad (region D in FIGS. 4 and 5). The chip mount pad is a place for mounting a silicon chip 408. Regions A and D form a good thermal conductive pathway due to direct or almost direct contact with a heat spreader 402. Moreover, conventional thermal vias are also formed underneath the chip mount pad (as shown in region E of FIGS. 4 and 5). Therefore, heat generated by the silicon chip can be more readily transferred from the carrier to its bond-attached motherboard outside.

Because the silicon chip is directly attached to the surface metallic layer 406, and the surface metallic layer is in direct contact or almost direct contact with the heat spreader 402, heat conductive path is direct and short. Hence, heat generated by the silicon chip is able to dissipate with minimal thermal resistance and without having to add in extra materials or increase production cost.

FIG. 5 is a cross-sectional view showing a package structure having an additional external heat sink according to one preferred embodiment of this invention. Methods similar to the one described in FIG. 4 are used to form a printed circuit board. The printed circuit board includes an external connection structure 410 such as a BGA, a conductive wire layer or a multi-layered core layer 400, a heat spreader 402 with a pattern-embossed surface tightly attached to the top of the conductive wire layer 400. The edge of this heat spreader 402 also has an additional protruding pattern (the B region in FIG. 5), an adhesive glue layer 404, and a metallic layer 406 press-joined to the heat spreader 402 or the adhesive glue layer. A portion of the heat spreader 406 is in direct contact or almost direct contact with the metallic layer 406. A silicon chip 408 is attached to the top surface of the metallic layer 406, and then the chip 408 is wire bonded before being enclosed within a plastic package. Subsequently, a heat sink 514 is attached to the surface metallic layer 406 either by a thermal glue or thermal epoxy, or mechanically by screws. The attachment is made such that B regions of the heat sink 514 are in direct contact or almost in direct contact with metal pads in the C regions of the metallic layer 406. The metal pads in the C regions are copper pads better known as thermal pads, which can provide good thermal conductivity.

In FIG. 5, besides having a direct or almost direct heat dissipation pathways through the heat spreader 402 as shown in FIG. 4, a heat sink is further added by attaching it through the C and B regions that surround the silicon chip. Therefore, heat dissipation from the silicon chip is further facilitated. Furthermore, the method of installing a heat sink on top of the printed circuit board is simple. In other words, heat can be dissipated from the silicon chip much faster without increasing manufacturing difficulties.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following, claims and their equivalents.

What is claimed is:

1. A printed circuit board with a thermal conductive structure, the printed circuit board comprising:
   a plurality of clue layers;
   a surface metallic layer located on a glue layer at one side of the printed circuit board;
   a plurality of metallic layers separately located between the glue layers;
   a heat spreader disposed in the printed circuit board between the glue layers, wherein a portion of the heat spreader exposed by the surface of the printed circuit board possesses an embossed pattern on its surface and a exposed surface of the heat spreader is in thermally-conductive contact with the surface metallic layer to form a chip mount pad; and
   a plurality of thermal vias penetrating through the printed circuit board wherein several of the thermal vias are in contact with the chip mount pad.

2. The structure of claim 1, wherein the heat spreader is formed from a material which includes a metallic layer.

3. The structure of claim 2, wherein through holes are drilled in the metallic heat spreader before a punch press is used to form the embossed pattern on its surface.

4. The structure of claim 2, wherein through holes are drilled in the metallic heat spreader before photolithograplic and etching, methods are used to form the embossed pattern on its surface.

5. The structure of claim 2, wherein photolithographic and etching methods are used to form a plurality of through holes in the metallic heat spreader before a punch press is used to form the embossed pattern on its surface.

6. The structure of claim 2, wherein photolithographic and etching methods are used to form a plurality of through holes in the metallic heat spreader before the same methods arc used to form the embossed pattern on its surface.

7. The structure of claim 1, wherein the heat spreader is made of ceramic.

8. The structure of claim 7, wherein the embossed pattern on the ceramic heat spreader is formed by a molding method.

9. The structure of claim 1, wherein the heat spreader is made of polymer.

10. The structure of claim 9, wherein the embossed pattern on the polymer heat spreader is formed by a molding method.

11. The structure of claim 1, wherein the thermal conductive structure is formed by pressing the thermal spreader against one side of a conductive wire layer or one side of a multi-layered stack so that they are bonded together.

12. The structure of claim 11, wherein the other side of the conductive wire layer or the multi-layered stack has an externally connected structure.

13. The structure of claim 1, wherein the surface metallic layer is attached to the heat spreader by applying a vacuum pressure.

14. The structure of claim 1, wherein the surface metallic layer is attached to the heat spreader by using hot adhesive glue and applying a pressure.

15. The structure of claim 1, wherein a silicon chip or silicon chips can be attached to a chip mount pad on the top surface of the surface metallic layer.

16. The structure of claim 1, wherein an external heat sink can be attached to heat sink pads on the top surface of the surface metallic layer.

17. A printed circuit board with a thermal conductive structure, the printed circuit board comprising:

a plurality of clue layers;

a surface metallic layer located on a glue layer at one side of the printed circuit board;

a plurality of metallic layers separately located between the glue layers;

a heat spreader disposed in the printed circuit board between the glue layers wherein a portion of the heat spreader exposed by the surface of the printed circuit board possesses an embossed pattern on its surface and a exposed surface of the heat spreader is in thermally conductive contact with the surface metallic layer to form a chip mount pad;

a plurality of thermal vias penetrating through the printed circuit board wherein several of the thermal vias are in contact with the chip mount pad; and an external heat sink attached to the top surface of the surface metallic layer.

18. The structure of claim 17, wherein the heat spreader is formed from a material which include a metallic layer.

19. The structure of claim 18, wherein through holes are drilled in the metallic heat spreader before a punch press is used to form the embossed pattern on its surface.

20. The structure of claim 18, wherein through holes are drilled in the metallic heat spreader before photolithographic and etching methods are used to form the embossed pattern on its surface.

21. The structure of claim 18, wherein photolithographic and etching methods are used to form a plurality of through holes in the metallic heat spreader before a punch press is used to form the embossed pattern on its surface.

22. The structure of claim 18, wherein photolithographic and etching methods are used to form a plurality of through holes in the metallic heat spreader before the same methods are used to form the embossed pattern on its surface.

23. The structure of claim 17, wherein the heat spreader is made of ceramic.

24. The structure of claim 17, wherein the embossed pattern on the ceramic heat spreader is formed by a molding method.

25. The structure of claim 17, wherein the heat spreader is made of a polymer.

26. The structure of claim 24, wherein the embossed pattern on the polymer heat spreader is formed by a molding method.

27. The structure of claim 17, wherein the thermal conductive structure is formed by pressing the thermal spreader against one side of a conductive wire layer or one side of a multi-layered stack so that they are bonded together.

28. The structure of claim 27, wherein the other side of the conductive wire layer or the multi-layered stack has an externally connected structure.

29. The structure of claim 17, wherein the surface metallic layer is attached to the heat spreader by applying a vacuum pressure.

30. The structure of claim 17, wherein the surface metallic layer is attached to the heat spreader by using hot adhesive glue and applying a pressure.

31. The structure of claim 17, wherein a silicon chip or silicon chips can be attached to a chip mount pad on the top surface of the surface metallic layer.

* * * * *